(12) United States Patent  
Long et al.

(10) Patent No.: US 10,591,790 B2  
(45) Date of Patent: Mar. 17, 2020

(54) ARRAY SUBSTRATE AND DISPLAY DEVICE

(71) Applicant: BOE TECHNOLOGY GROUP CO., LTD., Beijing (CN)

(72) Inventors: Chunping Long, Beijing (CN); Yongda Ma, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 61 days.

(21) Appl. No.: 15/807,451

(22) Filed: Nov. 8, 2017

(65) Prior Publication Data

US 2018/0267374 A1 Sep. 20, 2018

(30) Foreign Application Priority Data

Mar. 16, 2017 (CN) .................... 2017 2 0260140 U

(51) Int. Cl.

| | | |
|---|---|---|
| *G02F 1/1362* | (2006.01) | |
| *G02F 1/1343* | (2006.01) | |
| *H01L 27/12* | (2006.01) | |
| *H01L 29/49* | (2006.01) | |
| *H01L 29/786* | (2006.01) | |
| *H01L 29/66* | (2006.01) | |

(52) U.S. Cl.  
CPC .. *G02F 1/136227* (2013.01); *G02F 1/134309* (2013.01); *G02F 1/136213* (2013.01); *G02F 1/136286* (2013.01); *H01L 27/124* (2013.01); *H01L 27/1255* (2013.01); *H01L 27/1259* (2013.01); *H01L 29/4908* (2013.01); *H01L 29/6675* (2013.01); *H01L 29/78618* (2013.01)

(58) Field of Classification Search  
CPC ......... G02F 1/136227; G01F 1/136213; H01L 27/124  
See application file for complete search history.

(56) References Cited

U.S. PATENT DOCUMENTS

| | | | | |
|---|---|---|---|---|
| 5,960,309 | A * | 9/1999 | Takano | ............... H01L 23/5222 257/E23.144 |
| 8,237,163 | B2 * | 8/2012 | Moon | ............... G02F 1/136227 257/59 |
| 8,895,986 | B2 * | 11/2014 | Xu | ......................... H01L 27/12 257/59 |
| 2018/0259820 | A1 * | 9/2018 | Okada | ................... G02F 1/1368 |

* cited by examiner

*Primary Examiner* — Mark W Tornow  
*Assistant Examiner* — Abbigale A Boyle  
(74) *Attorney, Agent, or Firm* — Calfee, Halter & Griswold LLP

(57) ABSTRACT

An array substrate and a display device are provided, which relate to the field of display and are for alleviating or mitigating the problem of bad contact between the pixel electrode and the drain pad caused by deep via holes. The array substrate includes a plurality of pixel units, each including a drain pad, a pixel electrode and an insulating layer above the drain pad. The drain pad has a first via hole, and the insulating layer has a second via hole that exposes at least a portion of the first via hole and a portion of the drain pad around the first via hole. The pixel electrode extends along an inner wall of the second via hole and contacts the exposed portion of the drain pad.

14 Claims, 3 Drawing Sheets

ARRAY SUBSTRATE AND DISPLAY DEVICE

CROSS REFERENCE TO RELATED APPLICATION

This application claims priority to the patent application No. 201720260140.1 filed with the Patent Office of the People's Republic of China on Mar. 16, 2017, the entire disclosure of which is incorporated herein by reference.

TECHNICAL FIELD

The present disclosure relates to the technical field of display, and in particular to an array substrate and a display device.

BACKGROUND

One of the important components in a thin film transistor display panel is the array substrate, and an image is displayed by using the thin film transistor to drive pixels of liquid crystal or organic light-emitting diodes. The array substrate is provided with the thin film transistor, a pixel electrode, a gate line (also called as gate scanning line) and a data line (also called as data signal line) interlaced with each other, as well as a storage capacitor for storing pixel voltage.

In order to obtain an image with good quality, an uniform electric field for the liquid crystals or light-emitting diodes is necessary at the pixel region (i.e. a region where the pixel electrodes are located) by means of a planarization layer. Generally, a protective passivation layer and a planar organic material layer are formed on a source-drain metal layer (i.e. a drain pad that is in the same layer as the source and drain of the thin film transistor and that serves as an electrode of the storage capacitor), and the pixel electrode connects to the source-drain metal layer through a via hole penetrating the passivation layer and the organic planarization layer, thereby forming an electrical connection.

However, the organic planarization layer usually has a large thickness ranging from 1 µm to 5 µm, the via hole penetrating both the passivation layer and the organic planarization layer need to be formed by an overlay process (i.e. a process for forming the via hole need to be repeated several times at the same position). Since the via hole is rather deep (over 1 µm), photoresist residues are liable to occur on the surface of the source-drain metal layer, this would cause bad contact between the pixel electrode and the source-drain metal layer, which in turn would result in bright or dark spots on the display screen when performing displaying by a display device with the array substrate.

SUMMARY

In view of this, the embodiments of the present disclosure provide an array substrate, a display device and a method for fabricating the array substrate, so as to at least alleviate or mitigate the problem of bad contact between the pixel electrode and the drain pad caused by deep via holes, thus facilitating to achieve high quality image display.

The array substrate provided by the embodiments of the disclosure comprises a plurality of pixel units, each pixel unit comprising a drain pad, a pixel electrode and an insulating layer above the drain pad. The drain pad has a first via hole, and the insulating layer has a second via hole, wherein the second via hole exposes at least a portion of the first via hole and a portion of the drain pad around the first via hole, and the pixel electrode extends along an inner wall of the second via hole and contacts an exposed portion of the drain pad.

In some embodiments, the array substrate comprises a plurality of gate lines and a plurality of data lines, the gate lines and data lines are interlaced with each other, so as to divide the array substrate into the plurality of pixel units, the gate lines and data lines are separated by a gate insulating layer. The array substrate further comprises an active layer retaining pattern between the drain pad and the gate insulating layer, an orthographic projection of the active layer retaining pattern at least partially overlapping an orthographic projection of the second via hole on the gate insulating layer.

In some embodiments, the pixel unit includes a storage capacitor, a first electrode of the storage capacitor includes the drain pad, and a second electrode of the storage capacitor includes a common electrode line between two adjacent gate lines.

Further, the first electrode of the storage capacitor may further comprise the pixel electrode in contact with the drain pad.

In some embodiments, the active layer retaining pattern is smaller than a pattern of the drain pad.

In some embodiments, the active layer retaining pattern has an opening for exposing the gate insulating layer, an orthographic projection of the opening at least partially overlapping an orthographic projection of the first via hole on the gate insulating layer.

In some embodiments, each pixel unit further includes a thin film transistor and a drain connecting line for connecting a drain of the thin film transistor to the drain pad.

In some embodiments, the drain pad in each pixel unit has two first via holes, which are arranged at two sides of the drain connecting line, respectively.

In some embodiments, the array substrate comprises a substrate, wherein the insulating layer comprises a passivation layer and a planarization layer far away from the substrate in sequence.

In some embodiments, each of a length and a width of the opening is within a range of 1 µm-20 µm.

In some embodiments, at least one of the first via hole and the second via hole has a shape selected from a group consisting of a rectangle, a circle and an ellipse.

In some embodiments, each of a length and a width of the first via hole is within the range of 1 µm-20 µm, and/or each of a length and a width of the second via hole is within the range of 1 µm-20 µm.

In some embodiments, the active layer retaining pattern has a thickness within the range of 0.01 µm-1 µm.

Another embodiment of the disclosure provides a display device comprising an array substrate according to any one of above embodiments.

Yet another embodiment of the disclosure provides a method for fabricating an array substrate, the array substrate comprising a plurality of pixel units, each pixel unit having a thin film transistor, the method may comprise the following steps: fabricating a first metal thin film on a substrate and forming a common electrode line, a gate line and a gate of the thin film transistor based on the first metal thin film, depositing a gate insulating layer and an active layer thin film in sequence on the first metal thin film, etching the active layer thin film to form an active layer of the thin film transistor and an active layer retaining pattern in a storage capacitor region of the pixel unit, the active layer retaining pattern having an opening for exposing a portion of the gate insulating layer, forming a second metal thin film covering the gate insulating layer and the active layer retaining pattern, forming a first via hole in the second metal thin film, an orthographic projection of the first via hole overlapping an orthographic projection of the opening in the active layer retaining pattern on the substrate, depositing a passivation layer and a planarization layer in sequence on the second metal thin film, which cover the opening and the first via hole, and forming a second via hole penetrating the passivation layer and the planarization layer, the second via hole exposing at least a portion of the first via hole as well as a portion of the second metal thin film around the first via hole.

Further, in some embodiments, the method further comprises forming a pixel electrode along inner walls of the first via hole and the second via hole, the pixel electrode contacting the second metal thin film exposed by the second via hole.

BRIEF DESCRIPTION OF DRAWINGS

In order to set forth the technical solutions provided in the embodiments of the present disclosure more clearly, the drawings for depicting the embodiments will be introduced briefly below. The drawings below are merely some embodiments of the present disclosure, and those skilled in the art can obtain other drawings from these drawings without any inventive effort.

DETAILED DESCRIPTION OF EMBODIMENTS

Figure 1:
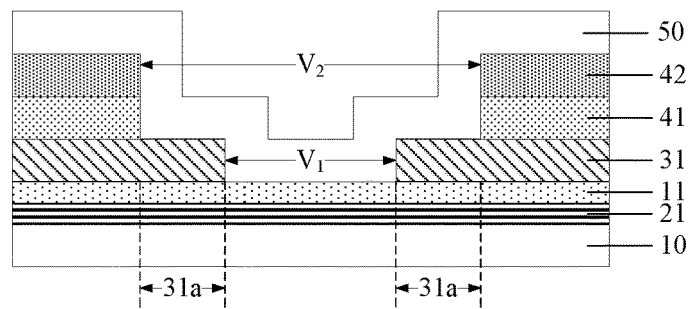
FIG. 1 is a schematic section view for the structure at a connection of a drain pad and a pixel electrode in an array substrate provide in an embodiment of the present disclosure.

Technical solutions in the embodiments of the disclosure will be described clearly and completely below with reference to the drawings. The described embodiments are merely some instead of all of the embodiments of the invention. On the basis of the embodiments described herein, all other embodiments that can be obtained by those skilled in the art without using any inventive effort shall fall into the scope of the invention.

It shall be noted that unless otherwise defined, all terms (including technical terms and scientific terms) mentioned in the embodiments of the present disclosure have the same meaning as that understood by those ordinarily skilled in the art. It shall also be appreciated that terms that are defined in common dictionaries should be interpreted as having the meaning consistent with that in the context of relevant technologies, but they should not be interpreted in an ideal or extremely formalized sense, unless they are explicitly defined in such manner herein.

For example, the terms "first" and "second" and similar wordings used in the description and claims of the present patent application do not indicate any sequence, number or significance, but they are only used for differentiating different objects. Such word as "include" or "comprise" means that an element or object preceding this word contains the elements or objects or their equivalents listed thereafter, without excluding other elements or objects. Words like "on/above" and "below/under" are used to indicate directional or positional relationships as shown in the drawings, and they are merely used for facilitating description of the technical solution in the present disclosure, but they do not indicate or suggest that the related devices or elements must be arranged in a particular orientation or be constructed and operated in a particular direction and position, so they shall not be construed as limiting the present invention.

Besides, the sizes of such elements as the TFTs in the array substrate involved in the embodiment of the present disclosure are very tiny, for the sake of clarity, the elements in the drawings for the embodiments of the present disclosure are all amplified in size, so they do not represent the actual size and proportion.

As shown in FIG. 1, an embodiment of the present disclosure provides an array substrate that comprises a plurality of pixel units. Each pixel unit comprises a drain pad 31, a pixel electrode 50 and an insulating layer above the drain pad 31. The drain pad 31 has a first via hole (indicated by $V_1$ in the figure), and the insulating layer 40 has a second via hole (indicated by $V_2$ in the figure). The second via hole exposes at least a portion of the first via hole $V_1$ and a portion (indicated by 31a in the figure) of the drain pad 31 around the first via hole $V_1$, and the pixel electrode 50 extends along an inner wall of the second via hole $V_2$ and contacts the exposed portion 31a of the drain pad 31.

The drain pad 31 is typically a structure arranged at the same layer as the source and drain of the thin film transistor in each pixel unit as well as the data line connected to the source, and it can serve as an electrode of the storage capacitor in each pixel unit so as to obtain a larger capacitor area.

The expression "arranged at the same layer" used in the embodiment of the present disclosure involves at least two patterns, and it refers to arranging at least two patterns on one supporting structure. For example, the at least two patterns may be formed by the same patterning process and using thin films made of the same material.

Therefore, the drain pad 31 in this embodiment can be arranged on the same supporting structure (e.g. gate insulating layer) as the drain and source of the thin film transistor and the data line previously mentioned, and they may be formed from the same material and have the same or similar thickness. In an example, the thickness thereof may range from 0.05 μm-1 μm.

The first via hole $V_1$ in the drain pad 31 may have an enclosed shape or an open shape, which is not limited to the embodiment of the present disclosure, as long as the via hole can expose the supporting structure (e.g. gate insulating layer) thereunder. The "enclosed" and "open" mentioned herein is directed to the profile of the via hole in a top plan view, "open" means the profile of the via hole has an opening, and "enclosed" means that profile does not have any opening.

Referring to FIG. 1, the second via hole $V_2$ exposes at least a portion of the first via hole $V_1$ and a portion 31a of the drain pad 31 around the first via hole $V_1$, that is, a step is formed at boundaries of the first via hole $V_1$ exposed by the second via hole $V_2$, so that the subsequently formed pixel electrode 50 can extend along the inner wall of the second via hole $V_2$ so as to directly contact the exposed portion 31a of the drain pad 31. The pixel electrode 50 can be made from ITO (Indium Tin Oxide), IZO (Indium Zinc Oxide), ITZO (Zine Indium Tin Oxide) or other transparent metal oxide conductive materials, and its thickness can be within the range of 0.01 μm-1 μm.

As shown in FIG. 1, the first via hole $V_1$ is arranged in the drain pad 31 to penetrate the drain pad 31, so the first via hole $V_1$ exposes the gate insulating layer. In this way, when forming the second via hole $V_2$ in the insulating layer 40 through a corresponding patterning process, the photoresist is typically coated by spin coating, a thickness of the coated photoresist corresponding to an area above the portion 31a of the drain pad 31 around the first via hole $V_1$ will be smaller than a thickness of the coated photoresist corresponding to an area above the first via hole $V_1$, so if there are photoresist residues, the residues would not likely be in the area with the smaller thickness (i.e. the area above the portion 31a of the drain pad 31 around the first via hole $V_1$), but they are more likely to be in the area with the larger thickness (i.e. the area right above the exposed gate insulating layer 11). Since the first via hole $V_1$ is right above the exposed gate insulating layer 11, where no drain pad metal exists, even if photoresist residues occur, it will not influence the contact between the pixel electrode 50 and the drain pad 31, thus ensuring a good electrical connection therebetween.

Examples of the patterning process mentioned herein include the process of forming specific patterns using a mask and by means of steps of photoresist exposing, developing and etching.

By means of the above via hole structure having a step as provided in the embodiment of the present disclosure, a step-shaped protrusion is formed at the area (i.e. 31a) in which the pixel electrode 50 contacts the drain pad 31. The photoresist covering the area having the step-shaped protrusion will be thinner than the photoresist covering the area without such protrusion, so during the process for forming the second via hole $V_2$, the thinner the photoresist, the less likely photoresist residues would occur, so that a good contact can be realized between the pixel electrode and the drain pad 31, which helps to improve the yield in process.

Figure 2:
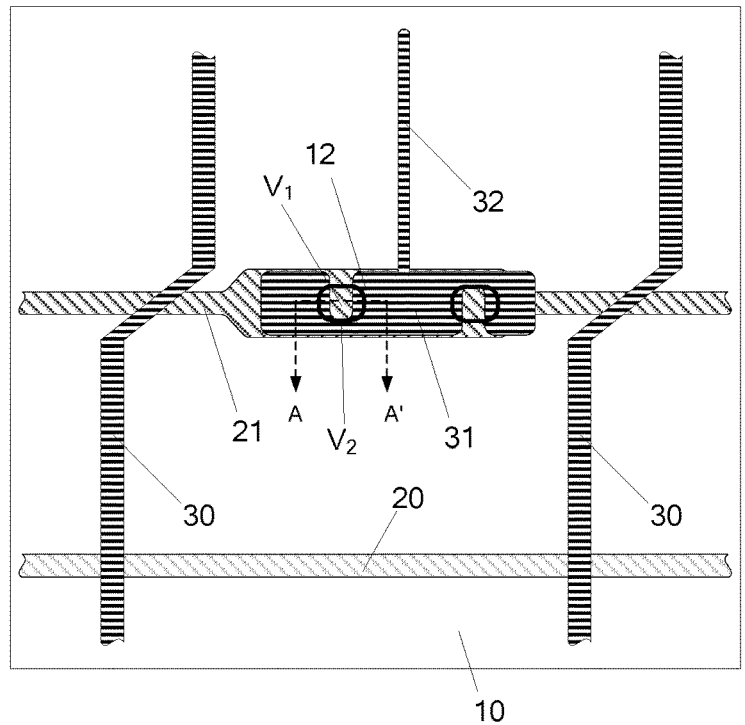
FIG. 2 is a partial top view of an array substrate provide in an embodiment of the present disclosure.
Figure 3:
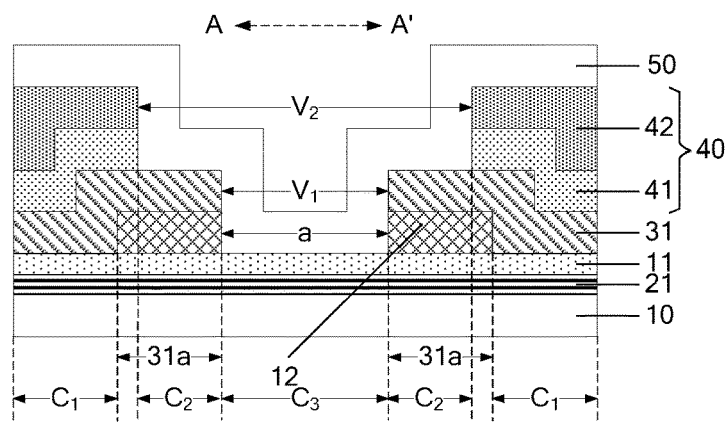
FIG. 3 is a sectional view taken along direction A-A' shown in FIG. 2.

In an embodiment of the present disclosure, as shown in FIGS. 2 and 3, the plurality of pixel units are defined by a plurality of gate lines 20 and a plurality of data line 30 that are interlaced with each other and separated by the gate insulating layer 11 (as the gate insulating layer is usually made of a transparent material, it is not shown in the plane view of FIG. 2). The array substrate further comprises a storage capacitor lower electrode line 21 that is on a substrate 10 and between two adjacent gate lines 20. The drain pad 31 is above the gate insulating layer 11 and overlaps the storage capacitor lower electrode line 21 (i.e. an orthographic projection of the drain pad 31 overlaps an orthographic projection of the lower electrode line 21 on the substrate 10). The pixel unit of the array substrate further comprises an active layer retaining pattern 12 between the drain pad 31 and the gate insulating layer 11, an orthographic projection of which at least partially overlaps an orthographic projection of the second via hole $V_2$ on the gate insulating layer 11.

In an embodiment of the present disclosure, the substrate 10 can specifically be a glass substrate or a flexible plastic substrate, or a stainless steel sheet substrate, with a thickness ranging from 0.01 mm to 1 mm.

The materials for the gate insulating layer 11 may comprise silicon nitride, silicon oxide, silicon oxynitride, alumina and any other organic/inorganic insulating medium having a certain dielectric constant. The gate insulating layer 11 can be a single-layered structure or a multi-layered structure, such as layers of silicon oxide and silicon nitride, with a thickness ranging from 0.01 μm to 1 μm.

Each pixel unit further comprises one or more thin film transistors, the gate of the thin film transistor is typically a branch extending from the gate line 20, and an active layer is formed on the gate.

The active layer retaining pattern 12 between the drain pad 31 and the gate insulating layer 11 is at the same layer as the active layer of the thin film transistor within each pixel unit. That is, both the active layer retaining pattern 12 and the active layer of the thin film transistor are arranged on the gate insulating layer 11, and they are above the storage capacitor lower electrode line 21 and the gate, respectively, and made of the same material and have the same or similar thickness. For example, they can be made from amorphous silicon, low temperature polycrystalline silicon or oxide semiconductor, with a thickness ranging from 0.01 μm to 1 μm.

Owing to the presence of the active layer retaining pattern 12, the step-shaped protrusion formed at boundaries of the second via hole $V_2$ between the first via hole $V_1$ is more protruding relative to the gate insulating layer 11 (a height of this protrusion is a sum of the thickness of the drain pad in the region 31a and the thickness of the active layer retaining pattern 12), so during the process for forming the second via hole V2, photoresist residue is less likely to occur in the region 31a, such that a good contact can be realized between the pixel electrode and the drain pad 31, which helps to improve the yield in process.

Theoretically, the storage capacitor in each pixel unit can be formed based on a common electrode line or the gate line. However, the capacitor structure utilizing the common electrode line can provide a larger capacitor area and capacitance value, which is advantageous to reduce pixel voltage deviation caused by the drain current of the thin film transistor, so in an embodiment of the present disclosure, the design of the storage capacitor based on the common electrode line is adopted, i.e. the common electrode line is used as a lower electrode of the storage capacitor. The other electrode of the storage capacitor may comprise the drain pad and/or the pixel electrode, and an insulating medium between the two electrodes of the storage capacitor includes the gate insulating layer, so as to increase the storage capacitance value by the insulating medium with a small thickness. When using the pixel electrode as the other electrode of the storage capacitor, via holes need to be formed in the passivation layer, while the via holes may limit the capacitor area. Therefore, in an embodiment of the present disclosure, the other electrode of the storage capacitor comprises the drain pad so as to obtain a larger capacitor area.

Hence, in the array substrate provided in an embodiment of the present disclosure, the storage capacitor lower electrode line 21 is just the common electrode line. Besides, there can be one or more common electrode lines between two adjacent gate lines 20, depending on the circuit design of the array substrate, which is not limited by the embodiments of the present disclosure.

Moreover, the common electrode line and the gate line 20 can be formed by the same patterning process, i.e. they are formed from the same material and have the same or similar thickness ranging from 0.05 μm to 1 μm.

The common electrode line can be made of such metal materials as Cu, Al, Mo, Ti, Cr, W, Nd, Nb, etc., it can also be made of alloys of these metal materials. Each of the gate line, common electrode line and data line can be a single-layered structure or a multi-layered structure, such as Mo\Al\Mo, Ti\Cu\Ti, Mo\Cu\Ti, etc.

It shall be noted that the common electrode line can be the common electrode line as generally understood by those skilled in the art, i.e. a metal wiring to which a common voltage for driving the display device is applied. Alternatively, it can be an ordinary electrode line, to which a constant DC voltage different from the common voltage can be applied.

Referring to FIG. 3, the active layer retaining pattern 12 includes an opening (indicated by a in the figure) for exposing the gate insulating layer 11, the opening a may overlap at least portion of the first via hole $V_1$ or completely overlap the first via hole $V_1$. Namely, the orthographic projection of the opening a at least partially overlaps the orthographic projection of the first via hole $V_1$ on the gate insulating layer 11. In the example of FIG. 3, a width of the opening a can be within the range of 1-20 μm.

Further, referring to FIG. 2, in the array substrate, the active layer retaining pattern 12 is smaller than the pattern of the drain pad 31. That is to say, within each pixel unit, an area of an orthographic projection of the active layer retaining pattern 12 on the gate insulating layer 11 is smaller than an area of an orthographic projection of the pattern of the drain pad 31 on the gate insulating layer 11. Thus, a different storage capacitor in the pixel unit is provided in this embodiment, which has a larger capacitor area to store pixel voltages.

Referring to FIG. 3, a first electrode (i.e. a lower electrode closer to the substrate 10) of the storage capacitor comprises a portion of the common electrode line, and a second electrode (i.e. an upper electrode farther from the substrate 10) of the storage capacitor may comprise three portions. A first portion of the second electrode of the storage capacitor consists of the drain pad 31, a second portion thereof comprises portions of the drain pad 31 and the pixel electrode 50 that are in direct contact, and a third portion thereof consists of the pixel electrode 50.

In this way, the storage capacitor in each pixel unit consists of three portions, which are indicated by $C_1$, $C_2$ and $C_3$ in the figure. An insulating medium between two electrodes (i.e. the drain pad 31 and the common electrode line) of the first portion $C_1$ of storage capacitor includes the gate insulating layer 11, but does not include the active layer retaining pattern 12. An insulating medium between two electrodes (i.e. the drain pad 31 and the pixel electrode 50 in direct contact, and the common electrode line) of the second portion $C_2$ of storage capacitor includes the gate insulating layer 11 and the active layer retaining pattern 12. An insulating medium between two electrodes (i.e. the pixel electrode 50 and the common electrode line) of the third portion $C_3$ of storage capacitor includes the gate insulating layer 11, but does not include the active layer retaining pattern 12.

In order to make the storage capacitor have a larger capacitor area, the width of the drain pad 31 is substantially equal to the width of the common electrode line within the storage capacitor area. Moreover, the active layer retaining pattern 12 in the storage capacitor area may include open or enclosed openings.

Further, referring to FIG. 2, each pixel unit further comprises the thin film transistor (not shown) and a drain connecting line 32 for connecting the drain of the thin film transistor to the drain pad 31.

In some embodiments, as shown in FIG. 2, there are two first via holes $V_1$ in the drain pad 31 in each pixel unit, which are arranged at the two sides of the drain connecting line 32, respectively, so that the pixel electrode 50 can be in full contact with and the drain pad 31 to ensure stability of the electrical connection, and the difficulty in via hole patterning can be reduced.

Referring to FIG. 1 or FIG. 3, the insulating layer 40 may include a passivation layer 41 and a planarization layer 42 that are far away from the substrate 10 in sequence. The passivation layer 41 is a protective insulating layer formed above the data line 30, the thin film transistor and the drain pad 31, it has a thickness within the range of 0.01-1 μm, and it generally includes a silicon nitride thin film whose thickness is far smaller than that of the organic planarization layer 42. The planarization layer 42 has a thickness within the range of 0.1-10 μm, and it generally includes such organic materials as acrylic, polyimide, resin, etc.

Figure 4:
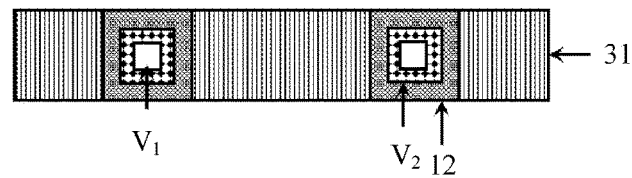
FIG. 4 is a plane view of a storage capacitor of an array substrate provide in an embodiment of the present disclosure.

FIG. 4 is a plane view of a storage capacitor provide in an embodiment of the present disclosure. As shown in FIG. 4, the drain pad 31 has a width within the range of 1-20 μm, which substantially covers the entirety of the gate insulating layer 11 (not shown in the figure) and at least partially covers the active layer retaining pattern 12 whose length and width are within the range of 1-20 μm. The active layer retaining pattern 12 includes an enclosed opening a (not shown in the figure), which exposes the gate insulating layer 11 and near which the enclosed first via hole $V_1$ in the drain pad 31 is formed. Each of the length and width of the enclosed first via hole $V_1$ is within the range of 1-20 μm. The size and shape of the enclosed first via hole $V_1$ are substantially similar to the size and shape of the enclosed opening a in the active layer retaining pattern 12, i.e. the active layer retaining pattern 12 is substantially completely covered by the pattern of the drain pad 31, and there is substantially no source-drain metal thin film at the position of the active layer retaining pattern 12 exposing the gate insulating layer 11. The second via hole $V_2$ in the insulating layer 40 is formed near the first via hole $V_1$ in the drain pad 31, the second via hole at least exposes a portion (or all) of the first via hole $V_1$ in the drain pad 31 as well as a portion of the drain pad 31 adjacent to the first via hole $V_1$. The exposed source-drain metal portion of the drain pad 31 will be in direct contact with the pixel electrode 50, and each of the length and width of the second via hole $V_2$ in the insulating layer 40 can be within the range of 1-20 μm.

The shape of the first via hole $V_1$ and/or the second via hole $V_2$ in this embodiment can be an enclosed square, rectangle, circle, ellipse or any other enclosed shape.

Figure 5:
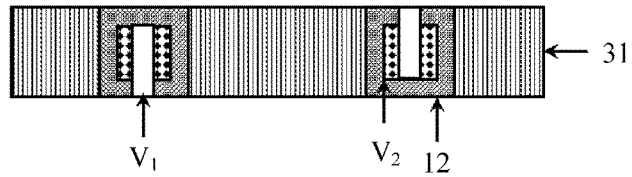
FIG. 5 is a plane view of a storage capacitor of an array substrate provide in another embodiment of the present disclosure.

FIG. 5 is a plane view of a storage capacitor provide in another embodiment of the present disclosure. As shown in FIG. 5, the drain pad 31 has a width within the range of 1-20 μm, which substantially completely covers the gate insulating layer 11 (not shown in the figure) and at least partially covers the active layer retaining pattern 12 whose length and width are within the range of 1-20 μm. The active layer retaining pattern 12 includes an enclosed opening a (not shown in the figure), which exposes the gate insulating layer 11 and near which the open first via hole $V_1$ in the drain pad 31 is formed. Each of the length and width of the open first via hole $V_1$ is within the range of 1-20 μm. At least a portion of the active layer retaining pattern 12 is covered by the drain pad 31, and there is substantially no source-drain metal thin film at the position of the active layer retaining pattern 12 exposing the gate insulating layer 11. The second via hole $V_2$ in the insulating layer 40 is formed near the first via hole $V_1$ in the drain pad 31 of the storage capacitor, the second via hole at least exposes a portion (or all) of the first via hole $V_1$ in the drain pad 31 as well as a portion of the drain pad 31 near the first via hole $V_1$. The exposed source-drain metal portion of the drain pad 31 is in direct contact with the pixel electrode 50, and each of the length and width of the second via hole $V_2$ in the insulating layer 40 can be within the range of 1-20 μm.

The shape of the first via hole $V_1$ and/or the second via hole $V_2$ in this embodiment can be an open square, rectangle, circle, ellipse or any other open shape. The open first via holes $V_1$ in two adjacent drain pads 31 have openings with opposite directions.

Figure 6:
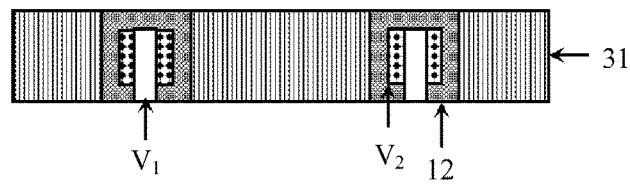
FIG. 6 is a plane view of a storage capacitor of an array substrate provide in another embodiment of the present disclosure.

FIG. 6 is a plane view of a storage capacitor provide in still another embodiment of the present disclosure. As shown in FIG. 6, the drain pad 31 has a width within the range of 1-20 μm, which substantially completely covers the gate insulating layer 11 (not shown in the figure) and at least partially covers the active layer retaining pattern 12 whose length and width are within the range of 1-20 μm. The active layer retaining pattern 12 includes an enclosed opening a (not shown in the figure), which exposes the gate insulating layer 11 and near which the open first via hole $V_1$ of the drain pad 31 is formed. At least a portion of the active layer retaining pattern 12 is covered by the drain pad 31, and there is substantially no source-drain metal thin film at the position of the active layer retaining pattern 12 exposing the gate insulating layer 11. The second via hole $V_2$ in the insulating layer 40 is formed near the first via hole $V_1$ in the drain pad 31 of the storage capacitor, the second via hole at least exposes a portion (or all) of the first via hole $V_1$ in the drain pad 31 as well as a portion of the drain pad 31 near the first via hole $V_1$. The exposed source-drain metal portion of the drain pad 31 is in direct contact with the pixel electrode 50, and each of the length and width of the second via hole $V_2$ in the insulating layer 40 can be within the range of 1-20 μm.

The shape of the first via hole $V_1$ and/or the second via hole $V_2$ in this embodiment can be an open square, rectangle, circle, ellipse or any other open shape. The open first via holes $V_1$ in respective drain pads 31 have openings with the same direction.

On the basis of the above, another embodiment of the present disclosure provides a method for fabricating an array substrate, which can obtain the array substrate as described in the above embodiments.

FIGS. 7-13 are flow charts of a method for fabricating an array substrate as provided in an embodiment of the present disclosure.

Figure 7:
FIGS. 7-13 illustrate some steps of a method for fabricating an array substrate as provided in an embodiment of the present disclosure.

In step S01, as shown in FIG. 7, by means of sputtering, magnetron sputtering or reactive sputtering, a one-layer metal thin film (which is also called a first metal thin film herein), e.g. Mo, Cr, etc., or a multi-layer metal thin film, e.g. Mo/Al/Mo, Ti/Al/Ti, Ta/Cu/Ta, TaN/Cu/TaN, MoNb/Cu, etc. is formed on the substrate 10, the metal thin film may have a thickness within the range of 0.01-1 μm. The common electrode line 21 is formed by means of photolithographic process, chemical etching or plasma etching, meanwhile, the gate line and the gate (not shown in the figure) are also formed.

Figure 8:
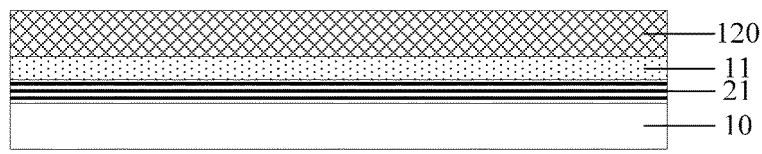

In step S02, as shown in FIG. 8, the gate insulating layer 11 and an active layer thin film 120 including a semiconductor thin film are deposited sequentially on the substrate 10 on which the common electrode line 21, the gate line and the gate have been formed.

In some examples, an insulating thin film and a semiconductor thin film can be deposited by Plasma Enhanced Chemical Vapor Deposition (PECVD), Low-pressure Chemical Vapor Deposition (LPCVD), Metal-Organic Chemical Vapor Deposition (MOCVD) or other chemical vapor deposition methods, or by sputtering process, so as to form the gate insulating layer 11 and the active layer thin film 120.

The material for the gate insulating layer 11 may comprise silicon nitride, silicon oxide, alumina, vanadium oxide, or a combination of these insulating materials, or any other insulating medium having certain dielectric constant and low leakage current, and a thickness of the gate insulating layer is with the range of 0.01-1 μm. The materials for the active layer thin film 120 may comprise amorphous silicon, low temperature polycrystalline silicon, indium gallium zinc oxide and zinc oxide, zinc oxide or other oxide semiconductor, or group III-V semiconductor, group II-VI semiconductor or organic semiconductor, and the thickness of the active layer thin film 120 is within the range of 0.01-1 μm.

Figure 9:
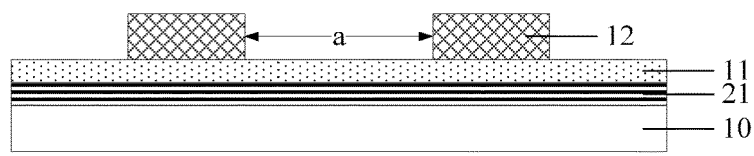

In step S03, as shown in FIG. 9, on the gate insulating layer 11, the active layer (not shown in this figure) above the gate for the thin film transistor as well as the active layer retaining pattern 12 in the storage capacitor region of the pixel unit are formed by the photolithographic process and the plasma etching process, the active layer retaining pattern 12 includes the enclosed or open opening a to expose the gate insulating layer 11. The active layer retaining pattern 12 has a size within the range of 2-20 μm, and the opening a has a size within the range of 2-20 μm.

Figure 10:
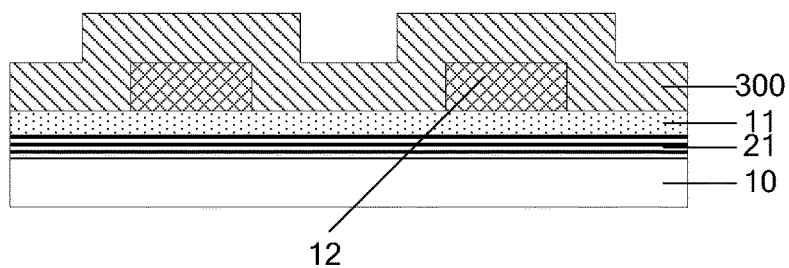

In step S04, as shown in FIG. 10, a source-drain metal thin film 300 (which is also called a second metal thin film herein) is formed on the gate insulating layer 11 and the active layer retaining pattern 12 by means of sputtering, magnetron sputtering or reactive sputtering, the source-drain metal thin film 300 can be a one-layer metal thin film, e.g. Mo, Cr, etc., or a multi-layer metal thin film, e.g. Mo/Al/Mo, Ti/Al/Ti, Ta/Cu/Ta, TaN/Cu/TaN, MoNb/Cu, etc., and may have a thickness within the range of 0.01-1 μm. This metal thin film can be used as the material for the data line, the source and drain of the thin film transistor, the drain connecting line and the drain pad that serves as an upper electrode of the storage capacitor.

Figure 11:
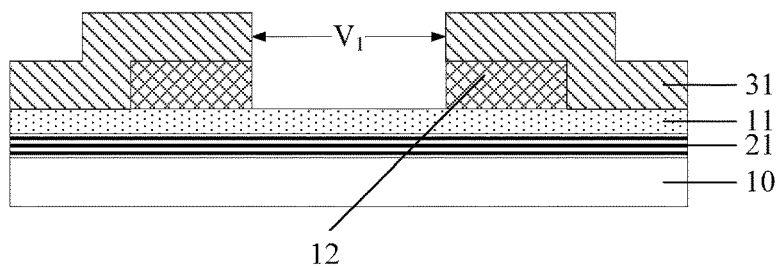

In step S05, as shown in FIG. 11, the drain pad 31 having the first via hole $V_1$ is formed by means of photolithographic process, chemical etching or plasma etching, meanwhile, the data line and the source and drain of the thin film transistor as well as the drain connecting line are also formed.

The drain pad 31 at least partially covers the active layer retaining pattern 12 in the storage capacitor region, and it basically does not cover the gate insulating layer exposed by the opening in the active layer retaining pattern 12. The drain pad 31 can be connected to the drain of the thin film transistor through the drain connecting line at the same layer; or it can be directly connected to the drain of the thin film transistor, namely, the drain connecting line and the drain pad 31 are an integral structure.

Figure 12:
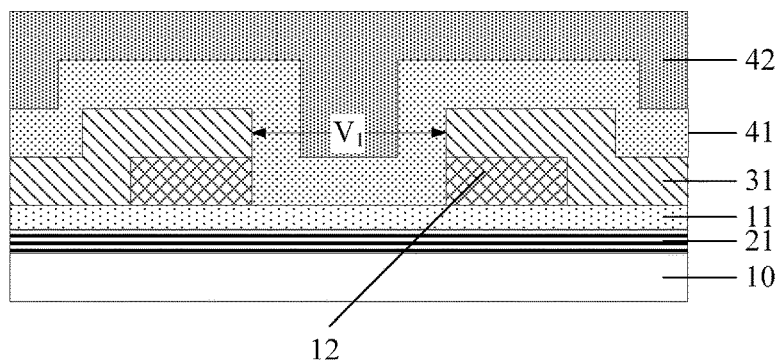

In step S06, as shown in FIG. 12, on the substrate 10 on which the drain pad 31, the data line, and the source and drain of the thin film transistor are formed, the passivation layer 41 and the planarization layer 42 including organic materials are deposited sequentially. The passivation layer 41 can be deposited by Plasma Enhanced Chemical Vapor Deposition (PECVD), Low-pressure Chemical Vapor Deposition (LPCVD), Metal-Organic Chemical Vapor Deposition (MOCVD) or other chemical vapor deposition methods, or by sputtering process, and the passivation layer 41 can be silicon nitride layer with a thickness within the range of 0.01-1 μm. The planarization layer 42 may include organic materials like acrylic, polyimide, etc., whose thickness is within the range of 0.1-10 μm, and it can be deposited above the passivation layer 41 by means of spin coating similar to photoresist coating.

Figure 13:
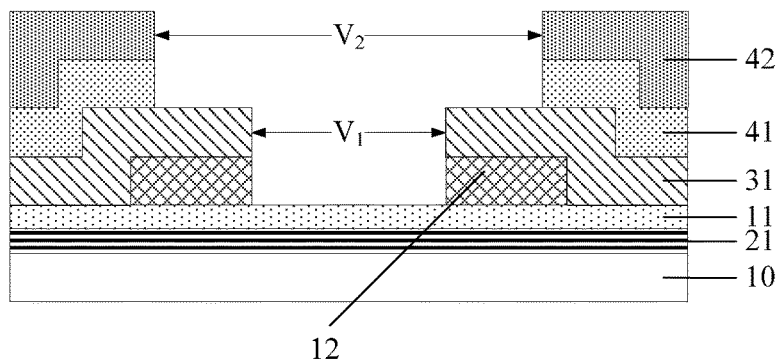

In step S07, as shown in FIG. 13, the second via hole $V_2$ penetrating the passivation layer 41 and the planarization layer 42 is formed. The ways of forming the via hole comprises, but are not limited to, the example ways as described below.

In an example, the via hole in the planarization layer 42 is formed by one photolithographic process, then the via hole in the passivation layer 41 is formed through chemical etching or plasma etching while using the planarization layer 42 as the mask, the positions of the via holes in the two insulating layers coincide, i.e. the second via hole $V_2$ is formed, which exposes the drain pad 31 and a portion of the gate insulating layer 11.

In an example, after forming the via hole in the planarization layer 42 by the photolithographic process, a layer of photoresist is coated on the planarization layer 42, and the via hole in the passivation layer 41 is formed by a second time of photolithographic process and by plasma etching or chemical etching.

In an example, after forming the via hole in the passivation layer 41 by the photolithographic process and by plasma etching or chemical etching, an organic material thin film is coated on the surface of the passivation layer 41 to form the planarization layer 42, and the via hole in the planarization layer 42 is formed by a second time of photolithographic process.

Further, the method for fabricating an array substrate as provided in the embodiment of the present disclosure may comprise forming pixel electrodes along inner walls of the first via hole and the second via hole, the pixel electrodes contacting the second metal thin film exposed by the second via hole.

By means of the steps described above, the array substrate described in the above embodiments can be obtained, but there may be variations in the treatment to the photoresist patterns during the photolithographic process for forming the opening a in the active layer retaining pattern 12, the first via hole $V_1$ in the drain pad 31, and the second via hole $V_2$ penetrating the passivation layer 41 and the planarization layer 42, so as to obtain the opening and/or via hole with an enclosed or an open shape.

With such method to fabricate the array substrate, the gate insulating layer 11 exposed by the opening in the active layer retaining pattern 12 will be lower than the active layer retaining pattern 12 and the drain pad 31, and the difference in height may be substantially within the range of 0.02-2 μm, so that the photoresist coated on the exposed gate insulating layer 11 will be thicker than the photoresist coated on the drain pad 31 by approximately 0.02-2 μm. During the photolithographic process, photoresist residues are more likely to occur at the position of the first via hole $V_1$, where no metal material of the drain pad 31 exists, so even if there are photoresist residues, the electrical connection between the drain pad and the pixel electrode 50 will not be influenced. Whereas at the positions of the second via hole $V_2$ other than the first via hole $V_1$, the coated photoresist would be relatively thin, so photoresist residues are unlikely to occur, where the drain pad will directly contact the pixel electrode 50, thus ensuring a good electrical connection and low contact resistance therebetween.

Another embodiment of the present disclosure further provides a display device comprising the array substrate as described in any of the above embodiments.

The display device can be any product or component having a display function, such as a liquid crystal display, a liquid crystal TV, an OLED (Organic Light-Emitting Diode) display, an OLED TV, a tablet PC, a mobile phone, a digital photo frame or a navigator.

It shall be noted that, in all embodiments of the present disclosure, the examples in which the source of the thin film transistor is connected to the data line, and the drain of the thin film transistor is electrically connected to the pixel electrode through the drain pad are described, but those skilled in the art shall understand that, since the source and the drain of the thin film transistor are interchangeable in terms of structure and composition, it is also possible that the drain of the thin film transistor is connected to the data line and the source of the thin film transistor is electrically connected to the pixel electrode through the drain pad, which is merely an equivalent substitution of the above embodiments of the present disclosure.

The above described are merely some embodiments of the invention, which do not intend to limit the protection scope of the present invention. Any variation or replacement that is easily conceivable by those skilled in the art on the basis of the embodiments of the present disclosure shall fall within the scope of the invention. Therefore, the scope of the present invention is determined by the appended claims.

The invention claimed is:

1. An array substrate comprising: a plurality of pixel units, each pixel unit comprising a drain pad, a pixel electrode and an insulating layer above the drain pad,
   wherein the drain pad has a first via hole, and the insulating layer has a second via hole, wherein the second via hole exposes at least a portion of the first via hole and a portion of the drain pad around the first via hole, and wherein the pixel electrode extends along an inner wall of the second via hole and contacts an exposed portion of the drain pad,
   wherein the array substrate comprises a plurality of gate lines and a plurality of data lines, the gate lines and data lines are interlaced with each other, so as to divide the array substrate into the plurality of pixel units, the gate lines and data lines are separated by a gate insulating layer,
   wherein the array substrate further comprises an active layer retaining pattern between the drain pad and the gate insulating layer, an orthographic projection of the active layer retaining pattern at least partially overlapping an orthographic projection of the second via hole on the gate insulating layer, and
   wherein the active layer retaining pattern has an opening for exposing the gate insulating layer, an orthographic projection of the opening at least partially overlapping an orthographic projection of the first via hole on the gate insulating layer.

2. The array substrate according to claim 1, wherein the pixel unit includes a storage capacitor, a first electrode of the storage capacitor includes the drain pad, and a second electrode of the storage capacitor includes a common electrode line between two adjacent gate lines.

3. The array substrate according to claim 2, wherein the first electrode of the storage capacitor further comprises the pixel electrode in contact with the drain pad.

4. The array substrate according to claim 1, wherein the active layer retaining pattern is smaller than a pattern of the drain pad.

5. The array substrate according to claim 1, wherein each pixel unit further includes a thin film transistor and a drain connecting line for connecting a drain of the thin film transistor to the drain pad.

6. The array substrate according to claim 5, wherein the drain pad in each pixel unit has two first via holes, which are arranged at two sides of the drain connecting line, respectively.

7. The array substrate according to claim 1, wherein the array substrate comprises a substrate, wherein the insulating layer comprises a passivation layer and a planarization layer far away from the substrate in sequence.

8. The array substrate according to claim 1, wherein each of a length and a width of the opening is within a range of 1 μm-20 μm.

9. The array substrate according to claim 1, wherein at least one of the first via hole and the second via hole has a shape selected from a group consisting of a rectangle, a circle and an ellipse.

10. The array substrate according to claim 1, wherein each of a length and a width of the first via hole is within the range of 1 μm-20 μm, and/or each of a length and a width of the second via hole is within the range of 1 μm-20 μm.

11. The array substrate according to claim 1, wherein the active layer retaining pattern has a thickness within the range of 0.01 μm-1 μm.

12. A display device, comprising: an array substrate according to claim 1.

13. A method for fabricating the array substrate as claimed in claim 1, the method comprising:

fabricating a first metal thin film on a substrate and forming a common electrode line, a gate line of the plurality of gate lines, and a gate of a thin film transistor based on the first metal thin film, depositing the gate insulating layer and an active layer thin film in sequence on the first metal thin film, etching the active layer thin film to form an active layer of the thin film transistor and the active layer retaining pattern in a storage capacitor region of the pixel unit, the active layer retaining pattern having the opening for exposing a portion of the gate insulating layer, forming a second metal thin film covering the gate insulating layer and the active layer retaining pattern, forming the first via hole in the second metal thin film, an orthographic projection of the first via hole overlapping an orthographic projection of the opening in the active layer retaining pattern on the substrate, depositing a passivation layer and a planarization layer in sequence on the second metal thin film, which cover the opening and the first via hole, and forming the second via hole penetrating the passivation layer and the planarization layer, the second via hole exposing at least a portion of the first via hole as well as a portion of the second metal thin film around the first via hole.

14. The method according to claim 13, wherein the method further comprises forming the pixel electrode along inner walls of the first via hole and the second via hole, the pixel electrode contacting the second metal thin film exposed by the second via hole.

* * * * *